United States Patent [19]

Miyashita et al.

[11] Patent Number: 4,971,920
[45] Date of Patent: Nov. 20, 1990

[54] GETTERING METHOD FOR SEMICONDUCTOR WAFERS

[75] Inventors: Moriya Miyashita, Kitakami; Ayako Maeda, Kawasaki, both of Japan

[73] Assignee: Kabushiki Kaisha Toshiba, Kawasaki, Japan

[21] Appl. No.: 275,868

[22] Filed: Nov. 25, 1988

[30] Foreign Application Priority Data

Nov. 28, 1987 [JP] Japan ............................ 62-300420

[51] Int. Cl.⁵ .................. H01L 21/304; H01L 21/463
[52] U.S. Cl. .......................................... 437/10; 437/9; 437/946; 134/1
[58] Field of Search ................ 134/1, 2, 3, 184; 437/9, 10, 946

[56] References Cited

U.S. PATENT DOCUMENTS 4,092,176  5/1978  Kozai et al. ........................ 134/186

FOREIGN PATENT DOCUMENTS 2168435  8/1973  France .
55-1114   1/1980  Japan ................................ 437/9
56-60022  5/1981  Japan ................................ 437/9
60-72233  4/1985  Japan ................................ 437/946
60-91648  5/1985  Japan .
61-79234  4/1986  Japan .
61-207022 9/1986  Japan ................................ 437/9

OTHER PUBLICATIONS

Wolf et al., Silicon Processing for the VLSI Era, vol. 1: Process Technology Lattice Press, Sunset Beach, CA (1986), p. 519.

Primary Examiner—Olik Chaudhuri
Assistant Examiner—Ourmazd Ojan
Attorney, Agent, or Firm—Finnegan, Henderson, Farabow, Garrett, and Dunner

[57] ABSTRACT

An ultrasonic wave is propagated to the surface of a semiconductor wafer in pure water to effect the gettering treatment with respect to the surface of the semiconductor wafer. Mechanical damages are formed on the surface of the semiconductor wafer to which the ultrasonic wave is applied, and at the same time the surface of the semiconductor wafer is cleaned. The mechanical damages serve to function as back side damage.

16 Claims, 4 Drawing Sheets

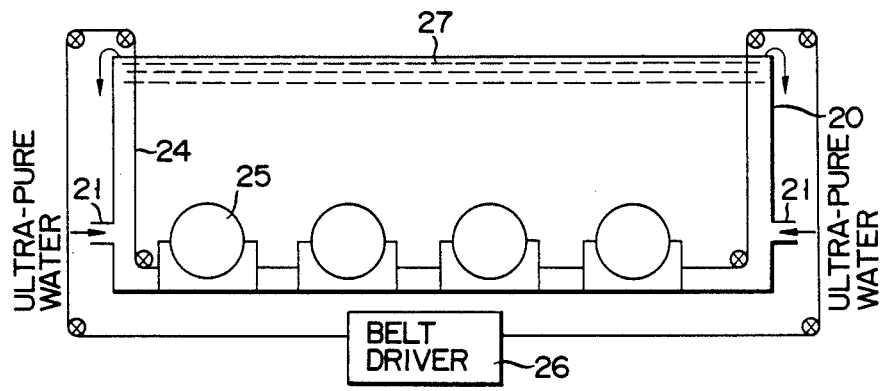
F I G. 5
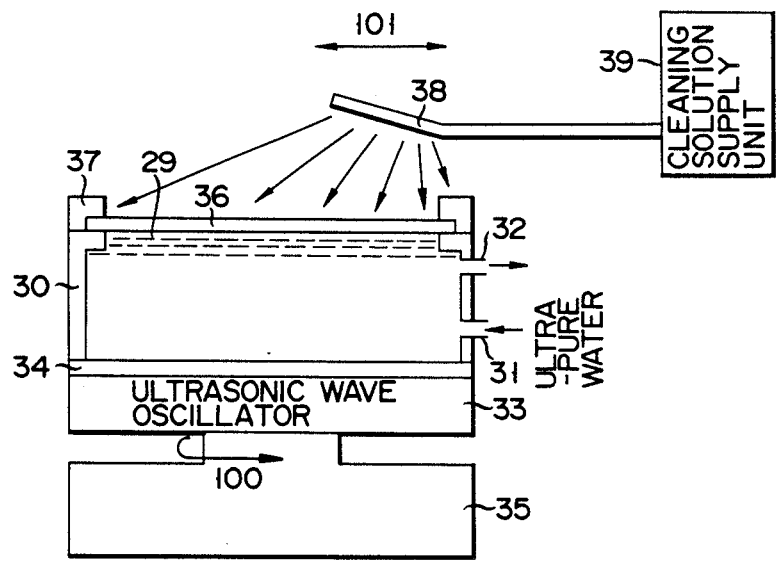
F I G. 6

GETTERING METHOD FOR SEMICONDUCTOR WAFERS

BACKGROUND OF THE INVENTION

1. Field of the Invention

This invention relates to a semiconductor wafer surface treatment method, and more particularly to a method for forming mechanical damages for contamination material-gettering on one surface of the wafer and for simultaneously cleaning the surface thereof.

2. Description of the Related Art

As the semiconductor element becomes increasingly available in more compact sizes, it becomes more important to reduce the influence of various types of contamination in the element manufacturing process. For example, contamination due to heavy metal such as Cu and Fe reduces the life time of minority carriers, changing the transistor characteristic and increasing the leak current. Further, contamination due to Na produces mobile ions in the oxide film, making the operation of the element unstable.

A so-called gettering method is known in the art for preventing the semiconductor wafer from becoming contaminated during manufacturing process. The gettering method includes a phosphor method and an HCl oxidation method, both of which are effected in the manufacturing process. Further, another gettering method is also known which provides gettering capability to the silicon wafer itself which is used as starting material. Such a gettering method includes an intrinsic gettering method utilizing oxygen precipitation caused inside the wafer and a back side damage (BSD) processing of lapping the back-side surface (opposite to the main surface in which semiconductor elements are formed) of the wafer and forming mechanical damages or distortion on the back-side surface of the wafer. In the heat treatment process, dislocation and stacking fault caused by the damage formed in the lapping and BSD processes may occur in the back-side surface of the wafer, and as a result, an area in which impurities of high diffusion speed are captured is provided, thus attaining the gettering effect.

The method for forming damage on the back-side surface of the wafer by lapping process has a disadvantage that the wafer will be warped after the lapping process. A sand blasting method is known as the BSD method and is used to form mechanical damage by blasting solution having fine particles of alumina dispersed therein to the back-side surface of the silicon wafer. The method is effective to mechanically form damages, but has a disadvantage that high cleanliness required for the silicon wafer used for the semiconductor element manufacturing process cannot be attained. That is, the solution having fine particles of alumina dispersed therein contains metal impurities such as Fe, Cr, Ni and Cu although they are small in amount. It is frequently determined by surface analysis by use of an ion micro-analyzer that the metal impurities are fixedly attached as surface contamination material to the wafer after the processing. Further, the wafer is finished with rough surface to provide surface irregularities. Since the solution containing alumina is blasted onto the irregular surface, fine particles of alumina run into and held in the back-side surface of the wafer. As a result, process defects will be caused in the semiconductor element manufacturing process in the same manner as in the case of surface contamination due to metal impurities.

Further, it is common practice to process the semiconductor wafers in a clean room from the view point of contamination control. However, since the sand blast method is effected by blasting solution containing fine particles of alumina at a high pressure, it becomes difficult to maintain the operation atmosphere of high cleanliness.

Thus, in the conventional semiconductor wafer surface treatment method, it is substantially impossible to maintain the high cleanliness when mechanical damages are formed on the back-side surface of the wafer.

SUMMARY OF THE INVENTION

An object of this invention is to provide a semiconductor wafer surface treatment method in which mechanical damages can be formed on the back-side surface of the wafer under the high cleanliness condition, and at the same time, the wafer surface can be cleaned.

According to one embodiment of this invention, there is provided a semiconductor wafer surface treatment method comprising the steps of generating ultrasonic waves; and propagating the ultrasonic waves to the surface of the semiconductor wafer via pure water to form mechanical damages only on one surface of the semiconductor wafer, at the same time clean the surface of the semiconductor wafer.

With the treatment method, ultrasonic waves are propagated in pure water and strike the surface of the semiconductor wafer to form mechanical damages which serves as the back side damage. At this time, since pure water comes into contact with the semiconductor wafer to clean the wafer surface, there is no possibility that impurities such as heavy metal and Na are attached as contamination material to the wafer surface and remains on the wafer surface after the processing as in the conventional case.

Thus, it becomes possible to provide a semiconductor wafer surface treatment method in which clean mechanical damages can be formed on the back-side surface of the wafer and at the same time the wafer surface can be cleaned.

BRIEF DESCRIPTION OF THE DRAWINGS

FIG. 5 is a front view of the treatment device shown in FIG. 4;

FIG. 6 is a front view of a fourth construction example of a treatment device used to effect a treatment method of this invention;

DETAILED DESCRIPTION OF THE PREFERRED EMBODIMENTS

Figure 1:
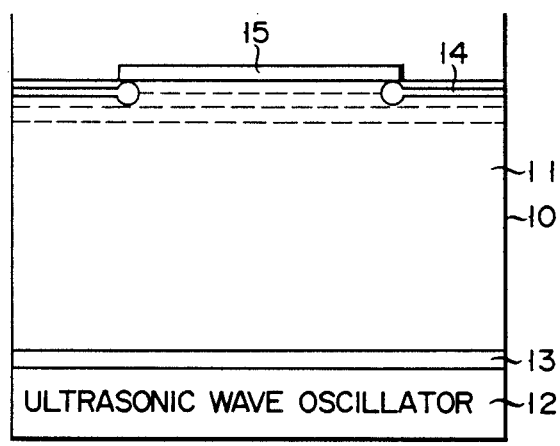
FIG. 1 is a front view of a first construction example of a treatment device used to effect a treatment method according to one embodiment of this invention.
Figure 2:
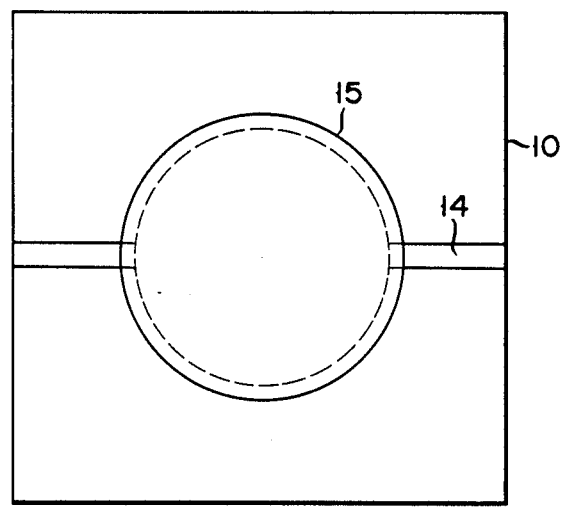
FIG. 2 is a top plan view of the treatment device shown in FIG. 1.

FIG. 1 is a front view of a first construction example of a treatment device used to effect a treatment method of this invention, and FIG. 2 is a top plan view of the treatment device. In this case, treatment bath 10 is shown to be partly cut away to clearly show the internal structure thereof in FIG. 1. Treatment bath 10 is filled with ultra-pure water 11 or pure water. Ultrasonic wave oscillator 12 and ultrasonic wave diaphragm 13 are disposed on the bottom portion of treatment bath 10, and the ultrasonic waves generated thereby are propagated into ultra-pure water 11. Further, wafer holding ring 14 formed of Teflon is disposed on the upper portion of treatment bath 10, and silicon wafer 15 having mirror-finished surfaces on both sides is horizontally disposed on ring 14 with the back-side surface thereof facing downward. The back-side surface of wafer 15 is a surface opposite to the main surface in which semiconductor elements are to be formed in a succeeding process.

With the treatment device of this construction, treatment bath 10 is filled with ultra-pure water 11, and silicon wafer 15 is disposed on ring 14 so that the back-side surface thereof will be set in contact with ultra-pure water 11. Then, ultrasonic wave oscillator 12 is operated to vibrate the ultrasonic wave diaphragm 13, thus generating ultrasonic waves. In this case, it is preferable to select the ultrasonic wave output to be within the range of 50 W to 500 W and to select the frequency to be within the range of 10 KHz to 100 KHz. At this time, mechanical damages in the form of irregular projections and depressions are formed on the back-side surface of wafer 15, which is in contact with ultra-pure water 11, by propagating an ultrasonic waves in ultra-pure water 11, whereby the back-side surface of wafer 15 is simultaneously cleaned.

The inventors of this application have brought about the treatment by using an ultrasonic wave diaphragm of 200 mm×200 mm and propagating an ultrasonic wave with a frequency of 28 KHz and an output power of 300 W into ultra-pure water 11. As a result of this, mechanical damages were formed at a density of approx. $1 \times 10^5$ cm$^{-2}$ on the back-side surface of silicon wafer 15. It was also determined from the results of further analysis that, since ultra-pure water 11 was used in this case, the number of fine impurity particles attached to the back-side surface of wafer 15 were suppressed to be less than 5 for wafer 15 with a diameter of 5 inches, and metal contamination due to Cu, Fe, Ni, Al or the like was suppressed to be less than $2 \times 10^{10}$ cm$^{-2}$. Thus, the wafer was found to have an extremely clean surface.

Figure 3:
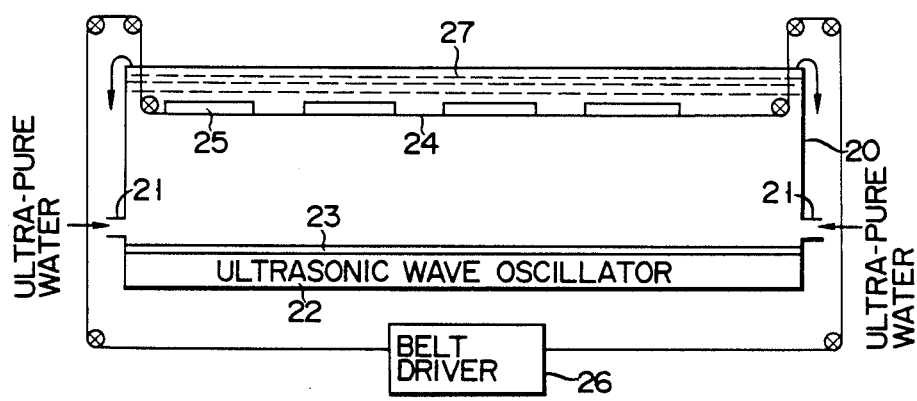
FIG. 3 is a front view of a second construction example of a treatment device used to effect a treatment method of this invention.

FIG. 3 is a front view schematically showing another construction example of a treatment device used to effect a treatment method of this invention. In FIG. 3, treatment bath 20 is also partly cut away so as to clearly show the internal structure of the treatment device. In this case, ultra-pure water 27 is supplied via supply port 21 into treatment bath 20 and overflows from the upper portion thereof. Further, ultrasonic wave oscillator 22 and ultrasonic wave diaphragm 23 are disposed on the bottom portion of treatment bath 20, and the ultrasonic waves generated thereby are propagated into the ultra-pure water of treatment bath 20. Carrier belt 24 of silicone rubber is mounted approx. 26.4 mm above the upper surface of ultrasonic wave diaphragm 23, and silicon wafers 25 are placed on carrier belt 24 with their back-side surfaces facing downward, so that they can be sequentially transferred into and then carried out of treatment bath 20 by the carrier belt. Carrier belt 24 is driven by belt driver 26 disposed outside treatment bath 20. Silicon wafer 25 to be processed is carried out of treatment bath 20, for example, 15 minutes after it has been transferred thereinto.

With the treatment device of this construction, ultra-pure water 27 is supplied into treatment bath 20 via supply port 21, and silicon wafers 25 are placed on carrier belt 24 and sequentially transferred into treatment bath 20. Then, ultrasonic wave oscillator 22 is operated to vibrate ultrasonic wave diaphragm 23, thus effecting the treatment operation. In this case the output power of the ultrasonic waves is set at 500 W and the frequency thereof is set at 28 KHz. In this way, an ultrasonic wave is propagated via ultra-pure water 27 to strike the back-side surface of each silicon wafer 25, thus forming mechanical damages in the form of irregular projections and depressions. Also, the back-side surface of each silicon wafer 25 is simultaneously cleaned by the ultrasonic waves. Further, since the entire portion of wafer 25 is submerged in ultra-pure water 27, the main surface of each wafer 25 to which the ultrasonic wave does not directly strike can be cleaned by the reflection waves from the surface of ultra-pure water 27.

Figure 4:
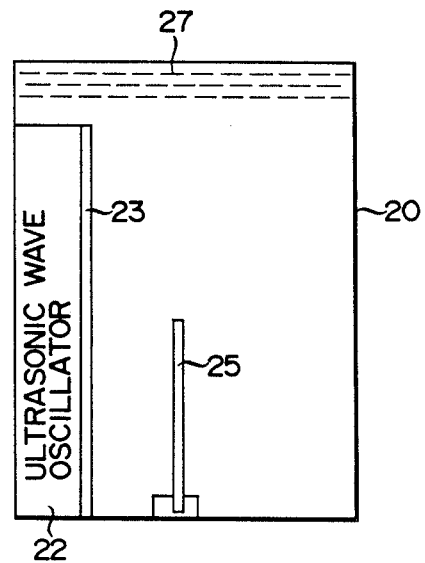
FIG. 4 is a side view of a third construction example of a treatment device used to effect a treatment method of this invention.

FIG. 4 is a side view of a third construction example of a treatment device used to effect a treatment method of this invention, and FIG. 5 is a front view of the treatment device. Also, in FIGS. 4 and 5, treatment bath 20 is shown to be partly cut away in order to clearly illustrate the internal structure thereof. In the treatment device shown in FIG. 3, ultrasonic wave oscillator 22 and ultrasonic wave diaphragm 23 are disposed on treatment bath 20, and silicon wafers 25 are processed while they are being carried along by carrier belt 24 with their back-side surfaces thereof horizontally held in treatment bath 20. In contrast, in the treatment device shown in FIGS. 4 and 5, ultrasonic wave oscillator 22 and ultrasonic wave diaphragm 23 are disposed on the side wall of treatment bath 20, and silicon wafers 25 having their back-side surfaces thereof facing ultrasonic wave diaphragm 23 are processed while they are being carried along by carrier belt 24 and vertically held in treatment bath 20. When wafers 25 are processed by the above treatment device, mechanical damages are formed in the form of projections and depressions on the back-side surface of each wafer 25 which has been directly struck by the ultrasonic wave generated from ultrasonic wave diaphragm 23. At the same time, the back-side surface of wafer 25 is cleaned, and the main surface of wafer 25 is also cleaned by ultrasonic waves reflected from the opposite side wall of treatment bath 20.

Figure 7:
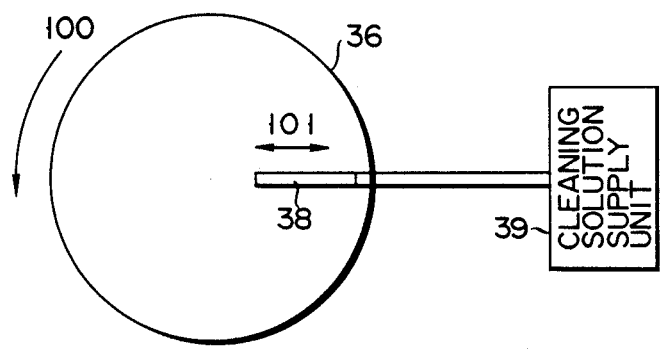
FIG. 7 is a top plan view of the treatment device shown in FIG. 6.

FIG. 6 is a front view of still another construction example of a treatment device used to effect a treatment method of this invention, and FIG. 7 is a top plan view of the treatment device. Ultra-pure water 27 is supplied into treatment bath 30 via supply port 31, and ultra-pure water 29 overflowing from treatment bath 30 is discharged via discharging port 32. Ultrasonic wave oscillator 33 and ultrasonic wave diaphragm 34 are disposed on treatment bath 30, and the ultrasonic wave generated thereby is propagated into ultra-pure water 29 of treatment bath 30. Further, treatment bath 30 is disposed on rotating driver 35 so as to be rotatable in a direction indicated by arrow 100. Silicon wafer 36 to be processed is disposed with its back-side surface thereof in contact with ultra-pure water 29 on the upper portion of treatment bath 30. Silicon wafer 36 thus disposed is fixed on treatment bath 30 by fixing member 37. Further, nozzle 38 is placed above wafer 36 disposed on treatment bath 30. Nozzle 38 is moved by a driving mechanism (not shown) in a direction indicated by arrow 101, and a cleaning solution is supplied to nozzle 38 from cleaning solution supply section 39. Nozzle 38 sprays cleaning solution at a high pressure onto the surface of wafer 36.

With the treatment device of this construction, cleaning solution is sprayed at a high pressure onto the surface of wafer 36, and an ultrasonic wave oscillator 33 is simultaneously operated to vibrate ultrasonic wave diaphragm 34, thus generating the ultrasonic wave for processing the wafer. In this case, the output power of the ultrasonic waves is selected to be within the range of 50 W to 500 W, and the frequency is selected to be within the range of 10 KHz to 100 KHz. As a result, mechanical damages are formed on the back side surface of silicon wafer 36 which has been directly struck by an ultrasonic wave via ultra-pure water 29 and which has simultaneously had the back-side surface thereof cleaned. Further, silicon wafer 36 disposed on the upper portion of treatment bath 30 is rotated in a direction indicated by arrow 100 shown in FIG. 7, and a cleaning solution is sprayed at a high pressure from the nozzle onto the main surface of the silicon wafer 36. Thus, the main surface is cleaned by the cleaning solution sprayed thereon.

With the use of the treatment device described above, it was determined that mechanical damages were formed at a density of $1 \times 10^5$ cm$^{-2}$ only on the back-side surface of silicon wafer 36. In this case, since ultra-pure water 29 was used, the amount of contamination due to metal and fine impurity particles attached to the back-side surface of the wafer was reduced to the contamination amount present in those cases where the treatment devices shown in FIGS. 1, 3 and 5 were used.

Figure 8:
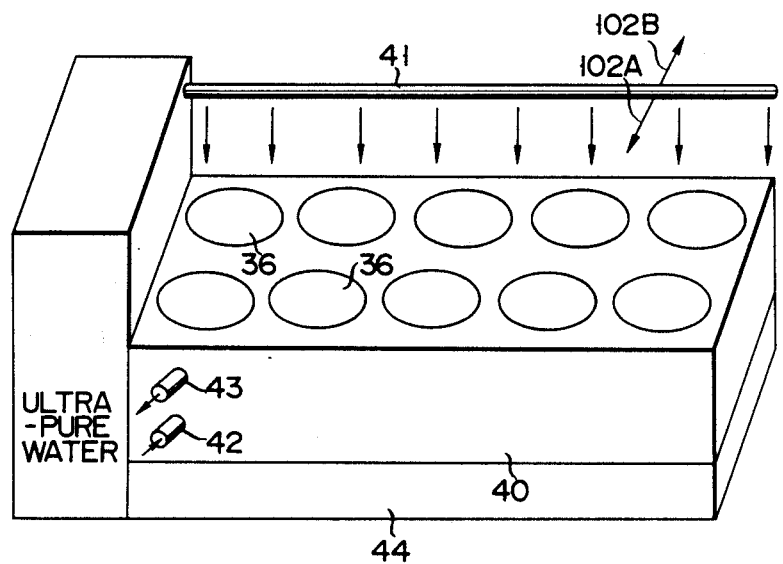
FIG. 8 is a perspective view of a fifth construction example of a treatment device used to effect a treatment method of this invention.

FIG. 8 is a front view of still another construction example of a treatment device used to effect a treatment method of this invention. In the treatment device shown in FIG. 6, only one wafer can be processed for each operation cycle, but with the treatment device of FIG. 8, a number of silicon wafers 36 can be disposed and processed on the upper portion of treatment bath 40. The back-side surface of each wafer 36 is subjected to the formation of a mechanical damage thereon and to a cleaning process via the ultrasonic waves propagating within the ultra-pure water in the same manner as described above. Further, the main surface of each wafer 36 is cleaned by a cleaning solution sprayed at a high pressure from nozzle 41 which is moved in the direction indicated by arrow 102A or 102B. Thus, a plurality of wafers 36 can be simultaneously processed. In treatment bath 40 of FIG. 8 are disposed supply port 42 for supplying the ultra-pure water, discharging port 43 for discharging the ultra-pure water which has over-flowed from treatment bath 40, and ultrasonic wave generator 44 having an ultrasonic wave oscillator and an ultrasonic wave diaphragm.

Through using the above-costructed treatment device, a plurality of wafers can be simultaneously processed, as in the cases of the treatment devices described with reference to FIGS. 3 and 5.

Thus, according to the treatment method described above, since mechanical damages are formed by applying ultrasonic waves to the back-side surface of the semiconductor wafer in a ultra-pure water, the back-side surface or both surfaces of the wafer can be simultaneously cleaned and the degree of cleanliness can be significantly improved as compared with the case wherein the damages are formed by the conventional sand blast method.

What is claimed is:

1. A semiconductor wafer treatment method, the semiconductor wafer including two opposed surfaces, the method comprising the steps of:
   generating ultrasonic waves; and
   propagating the ultrasonic waves to a desired surface of said semiconductor wafer via water to form mechanical damage on said desired surface of said semiconductor wafer and at the same time clean both surfaces of said semiconductor wafer by submerging the semiconductor wafer into a treatment bath filled with water, generating ultrasonic waves from ultrasonic wave generating means disposed to face the desired surface of said semiconductor wafer in said treatment bath, and propagating the ultrasonic waves into the water, the output power of the ultrasonic waves being in the range of 50 w to 500 w and the frequency of the ultrasonic waves being in the range of 10 kHz to 100 kHz.

2. A semiconductor wafer surface treatment method according to claim 1, wherein said water is pure water.

3. A semiconductor wafer surface treatment method according to claim 1, wherein said desired surface of said semiconductor wafer is a back-side surface opposite to a main surface in which semiconductor elements are to be formed in subsequent steps.

4. A semiconductor wafer surface treatment method according to claim 1, wherein said ultrasonic wave generating means is disposed on the bottom portion of said treatment bath, and a main surface of each of said semiconductor wafers opposite to said desired surface in which said mechanical damage is formed is cleaned by ultrasonic waves reflected from the surface of the water.

5. A semiconductor wafer surface treatment method according to claim 1, wherein said ultrasonic wave generating means is disposed on a first side wall portion of said treatment bath, and a main surface of each of said semiconductor wafers opposite to said desired surface in which said mechanical damages are formed is cleaned by ultrasonic waves reflected from a second side wall portion of said treatment bath which is opposite to the first side wall portion.

6. A semiconductor wafer treatment method, the semiconductor wafer having two opposed surfaces, the method comprising the steps of:
   generating ultrasonic waves; and
   propagating the ultrasonic waves, having an output power of 50 w to 500 w and an ultrasonic wave frequency of 10 kHz to 100 kHz, to a desired surface of said semiconductor wafer via water to form mechanical damage on the desired surface of said semiconductor wafer and at the same time clean both surfaces of said semiconductor wafer by placing said semiconductor wafer with the desired surface thereof in contact with the water disposed in a treatment bath, propagating ultrasonic waves generated from ultrasonic wave generating means disposed on the bottom of said treatment bath into the water to form mechanical damage on the desired surface of said semiconductor wafer and spraying cleaning solution onto the other surface of said semiconductor wafer from a nozzle disposed above the other surface of said semiconductor wafer to clean said other surfaces of said semiconductor wafer.

7. A semiconductor wafer surface treatment method according to claim 6, wherein the treatment is effected under a condition such that said semiconductor wafer is rotated.

8. A semiconductor wafer surface treatment method according to claim 6, wherein said nozzle is moved to clean said other surface of said semiconductor wafer.

9. A semiconductor wafer surface treatment method according to claim 6, wherein said water is pure water.

10. A semiconductor wafer surface treatment method according to claim 6, wherein said desired surface of said semiconductor wafer is a back-side surface opposite to a main surface in which semiconductor elements are to be formed.

11. A semiconductor wafer treatment method, the semiconductor wafer including two opposed surfaces, the method comprising the steps of:
    submerging the semiconductor wafer into a treatment bath filled with water; and
    generating ultrasonic waves, having output power in the range of 50 w to 500 w and a wave frequency of 10 kHz to 100 kHz, from ultrasonic wave generating means disposed to face the desired surface of said semiconductor wafer in said treatment bath, said ultrasonic waves propagating through the water to the desired surface of said semiconductor wafer to form mechanical damage on the desired surface and to simultaneously clean said desired surface.

12. A semiconductor wafer surface treatment method according to claim 11, wherein said water is pure water.

13. A semiconductor wafer surface treatment method according to claim 11, wherein said desired surface of said semiconductor wafer is a back-side surface opposite to a main surface in which semiconductor elements are to be formed in later steps.

14. A semiconductor wafer surface treatment method according to claim 11, wherein said ultrasonic wave generating means is disposed on the bottom portion of said treatment bath, and a main surface of each of said semiconductor wafers opposite to said desired surface in which said mechanical damages are formed is cleaned by ultrasonic wave reflected from the surface of the water.

15. A semiconductor wafer surface treatment method according to claim 11, wherein said ultrasonic wave generating means is disposed on a first side wall portion of said treatment bath, and a main surface of each of said semiconductor wafers opposite to said desired surface in which said mechanical damages are formed is cleaned by ultrasonic waves reflected from a second side wall portion of said treatment bath which is opposite to the first side wall portion.

16. A semiconductor wafer treatment method, the semiconductor wafer including two opposed surfaces, the method comprising the steps of:
    submerging at least a portion of a semiconductor wafer into a treatment bath filled with treatment solution;
    generating ultrasonic waves; and
    propagating the ultrasonic waves in the treatment solution to cause mechanical damage to at least one surface of the wafer sufficient for gettering and to simultaneously clean said at least one surface.

* * * * *